United States Patent
Koga et al.

(10) Patent No.: US 10,557,891 B2
(45) Date of Patent: Feb. 11, 2020

(54) BATTERY SYSTEM AND CONTROL METHOD THEREOF

(71) Applicant: TOYOTA JIDOSHA KABUSHIKI KAISHA, Toyota-shi, Aichi-ken (JP)

(72) Inventors: Tatsuya Koga, Toyota (JP); Kenichi Ohta, Nagoya (JP); Hiroki Nagai, Aichi-ken (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 135 days.

(21) Appl. No.: 15/951,617

(22) Filed: Apr. 12, 2018

(65) Prior Publication Data
US 2018/0313900 A1 Nov. 1, 2018

(30) Foreign Application Priority Data
Apr. 28, 2017 (JP) .................. 2017-089620

(51) Int. Cl.
*G01R 31/00* (2006.01)
*B60L 3/12* (2006.01)
(Continued)

(52) U.S. Cl.
CPC ............ *G01R 31/3835* (2019.01); *B60L 3/12* (2013.01); *B60L 58/12* (2019.02); *G01R 31/388* (2019.01);
(Continued)

(58) Field of Classification Search
CPC ..... G01R 31/3835; G01R 31/388; B60L 3/12; B60L 58/12; B60L 2240/547;
(Continued)

(56) References Cited

U.S. PATENT DOCUMENTS

| 2007/0096743 A1* | 5/2007 | Arai | G01R 31/392 |
| | | | 324/426 |
| 2007/0139015 A1* | 6/2007 | Seo | G01R 31/3828 |
| | | | 320/132 |

(Continued)

FOREIGN PATENT DOCUMENTS

| JP | 2014-139521 A | 7/2014 |
| JP | 2014-154399 A | 8/2014 |

(Continued)

OTHER PUBLICATIONS

Electropaedia, "State of Charge (SOC) Determination", https://www.mpoweruk.com/soc.htm, Woodbank Communications Ltd., 2005, 6 pages. (Year: 2005).*

*Primary Examiner* — Phallaka Kik
(74) *Attorney, Agent, or Firm* — Sughrue Mion, PLLC (57) ABSTRACT

An ECU obtains an OCV and an internal pressure, obtains a first estimated value of an SOC corresponding to the time of charging and a second estimated value of the SOC corresponding to the time of discharging using the obtained OCV and a first correspondence, obtains a third estimated value of an SOC corresponding to the time of charging and a fourth estimated value of the SOC corresponding to the time of discharging using the obtained internal pressure and a second correspondence, estimates the SOC using at least one of the first or the third estimated value when a first difference between the first and the third estimated value is less than a second difference between the second and the fourth estimated value, and estimates the SOC using at least one of the second or the fourth estimated value when the second difference is less than the first difference.

14 Claims, 5 Drawing Sheets

(51) Int. Cl.
*H01M 10/44* (2006.01)
*H01M 10/48* (2006.01)
*B60L 58/12* (2019.01)
*H02J 7/00* (2006.01)
*G01R 31/3835* (2019.01)
*G01R 31/388* (2019.01)
*H01M 10/0525* (2010.01)

(52) U.S. Cl.
CPC ............ *H01M 10/44* (2013.01); *H01M 10/48* (2013.01); *H02J 7/00* (2013.01); *B60L 2240/54* (2013.01); *B60L 2240/547* (2013.01); *B60L 2260/44* (2013.01); *H01M 10/0525* (2013.01); *H01M 2220/20* (2013.01); *Y02E 60/122* (2013.01)

(58) Field of Classification Search
CPC ........... B60L 2240/54; B60L 2260/44; H01M 10/44; H01M 10/38; H01M 10/0525; H01M 2220/20; Y02E 60/122; H02J 7/00
USPC ........................................ 320/132, 134, 136
See application file for complete search history.

(56) References Cited

U.S. PATENT DOCUMENTS

| | | | |
|---|---|---|---|
| 2007/0148532 A1* | 6/2007 | Lim | G01R 31/3828 |
| | | | 429/50 |
| 2007/0299620 A1* | 12/2007 | Yun | G01R 31/3842 |
| | | | 702/63 |
| 2009/0024338 A1* | 1/2009 | Suzuki | G01R 31/367 |
| | | | 702/63 |
| 2012/0306450 A1* | 12/2012 | Nakayama | G06F 1/263 |
| | | | 320/134 |
| 2014/0042973 A1* | 2/2014 | Kawahara | H01M 10/441 |
| | | | 320/118 |
| 2015/0355285 A1 | 12/2015 | Nishigaki et al. | |
| 2016/0072125 A1 | 3/2016 | Kimura et al. | |
| 2016/0336767 A1* | 11/2016 | Zane | H02J 7/0021 |
| 2017/0324255 A1* | 11/2017 | Crompton | H01M 10/0525 |
| 2017/0363690 A1* | 12/2017 | Kawamura | G01R 31/3648 |

FOREIGN PATENT DOCUMENTS

| | | |
|---|---|---|
| JP | 2014-192104 A | 10/2014 |
| JP | 2015-079621 A | 4/2015 |
| JP | 2016-058236 A | 4/2016 |
| WO | 2008/026476 A1 | 3/2008 |

* cited by examiner

BATTERY SYSTEM AND CONTROL METHOD THEREOF

INCORPORATION BY REFERENCE

The disclosure of Japanese Patent Application No. 2017-089620 filed on Apr. 28, 2017 including the specification, drawings and abstract is incorporated herein by reference in its entirety.

BACKGROUND

1. Technical Field

The present disclosure relates to a battery system and a control method thereof and specifically relates to a technique of estimating a state of charge using an open circuit voltage and an internal pressure of a secondary battery.

2. Description of Related Art

An electric vehicle on which a secondary battery for traveling is mounted has been widely used. In the electric vehicle, in order to appropriately control charging and discharging of a secondary battery, a technique of accurately estimating a state of charge (SOC) of the secondary battery is needed. As the technique, a technique of estimating an SOC of a secondary battery using an open circuit voltage (OCV) of the secondary battery is disclosed. For example WO 2008026476 discloses a technique of obtaining an OCV when an inter-terminal voltage of a secondary battery sufficiently reaches equilibrium and estimating an SOC based on the OCV using a characteristic curve representing a relationship between the OCV and the SOC.

SUMMARY

However, depending on a configuration of the secondary battery, a correspondence between the open circuit voltage and the SOC of the secondary battery may vary between the time of charging and the time of discharging. Therefore, the SOC is not uniquely determined based on the open circuit voltage, and there may be a case where the SOC cannot be accurately estimated based on the OCV.

The method disclosed in WO 2008026476 does not consider a case where a correspondence between the open circuit voltage and the SOC of the secondary battery varies between the time of charging and the time of discharging. Therefore, a desired estimation accuracy of SOC may not be obtained depending on charging-discharging history of a secondary battery.

The present disclosure provides: a battery system that accurately estimates an SOC of a secondary battery in which a correspondence between an open circuit voltage and the SOC varies between the time of charging and the time of discharging; and a control method thereof.

A first aspect of the present disclosure relates to a battery system including: a secondary battery configured such that a first correspondence between an open circuit voltage and a state of charge at a time of charging is partially different from the first correspondence at the time of discharging, and a second correspondence between an internal pressure and the state of charge at the time of charging is partially different from the second correspondence at the time of discharging; and an electronic control unit configured to estimate the state of charge of the secondary battery. The electronic control unit is configured to obtain the open circuit voltage and the internal pressure. The electronic control unit is configured to obtain a first estimated value of the SOC corresponding to the time of charging and a second estimated value of the SOC corresponding to the time of discharging using the obtained open circuit voltage and the first correspondence. The electronic control unit is configured to obtain a third estimated value of the SOC corresponding to the time of charging and a fourth estimated value of the SOC corresponding to the time of discharging using the obtained internal pressure and the second correspondence. The electronic control unit is configured to estimate the SOC using at least one of the first estimated value or the third estimated value when a first difference between the first estimated value and the third estimated value is less than a second difference between the second estimated value and the fourth estimated value. The electronic control unit is configured to estimate the SOC using at least one of the second estimated value or the fourth estimated value when the second difference is less than the first difference.

In the first aspect, for example, in a case where the estimation of the SOC using the first correspondence and the second correspondence at the time of charging is appropriate, the first difference is less than the second difference. In a case where the estimation of the SOC using the first correspondence and the second correspondence at the time of discharging is appropriate, the second difference is less than the first difference. As described above, by comparing the first difference and the second difference to each other, the SOC can be accurately estimated using the appropriate estimated value.

In the battery system according to the first aspect, in a case where the first difference is less than the second difference and the first estimated value and the third estimated value do not match each other, the electronic control unit may configured to estimate a value between the first estimated value and the third estimated value as the SOC.

In the first aspect, even in a case where the first estimated value and the third estimated value do not match each other due to error or the like, the SOC of the secondary battery can be accurately estimated by estimating a value between the first estimated value and the third estimated value as the SOC.

In the battery system according to the first aspect, the electronic control unit may configured to estimate an average value of the first estimated value and the third estimated value as the SOC.

In the battery system according to the first aspect, the electronic control unit may configured to estimate a value as the SOC, the value being calculated by multiplying the first estimated value and the third estimated value by two weighting factors having a sum of 1, respectively, and adding up the multiplied values.

In the battery system according to the first aspect, in a case where the second difference is less than the first difference and the second estimated value and the fourth estimated value do not match each other, the electronic control unit may configured to estimate a value between the second estimated value and the fourth estimated value as the SOC.

In the first aspect, even in a case where the second estimated value and the fourth estimated value do not match each other due to error or the like, the SOC of the secondary battery can be accurately estimated by estimating a value between the second estimated value and the fourth estimated value as the SOC.

In the battery system according to the first aspect, the electronic control unit may configured to estimate an average value of the second estimated value and the fourth estimated value as the SOC.

In the battery system according to the first aspect, the electronic control unit may configured to estimate a value as the SOC, the value being calculated by multiplying the second estimated value and the fourth estimated value by two weighting factors having a sum of 1, respectively, and adding up the multiplied values.

In the battery system according to the first aspect, in a case where the obtained open circuit voltage is in a predetermined range, the electronic control unit may configured to estimate the SOC using the first correspondence. The predetermined range is a range where the first correspondence at the time of charging and the first correspondence at the time of discharging match each other.

In the first aspect, in a range where the relationship between the open circuit voltage and the SOC matches each other between the time of charging and the time of discharging, the SOC of the secondary battery can be accurately estimated by estimating the SOC using the first correspondence.

In the battery system according to the first aspect, in a case where the obtained internal pressure is in a predetermined range, the electronic control unit may configured to estimate the SOC using the second correspondence. The predetermined range is a range where the second correspondence at the time of charging and the second correspondence at the time of discharging match each other.

In the first aspect, in a range where the relationship between the open internal pressure and the SOC matches each other between the time of charging and the time of discharging, the SOC of the secondary battery can be accurately estimated by estimating the SOC using the second correspondence.

In the battery system according to the first aspect, in a case where the obtained open circuit voltage is not in a range where the first correspondence at the time of charging and the first correspondence at the time of discharging match each other and the obtained internal pressure is not in a range where the second correspondence at the time of charging and the second correspondence at the time of discharging match each other, the electronic control unit configured to estimate the SOC using the first correspondence and the second correspondence.

In the battery system according to the first aspect, the electronic control unit may configured to perform charging and discharging of the secondary battery using the obtained SOC.

In the first aspect, the SOC of the secondary battery can be accurately estimated. Therefore, the charging and discharging of the secondary battery can be accurately controlled.

In the battery system according to the first aspect, in a case where the first difference is less than the second difference and the first estimated value and the third estimated value match each other, the electronic control unit configured to may estimate the first estimated value or the third estimated value as the SOC.

In the battery system according to the first aspect, in a case where the second difference is less than the first difference and the second estimated value and the fourth estimated value match each other, the electronic control unit may configured to estimate the second estimated value or the fourth estimated value as the SOC.

A second aspect of the present disclosure relates to a control method of a battery system including a secondary battery and an electronic control unit. The secondary battery is configured such that a first correspondence between an open circuit voltage and a state of charge at a time of charging is partially different from the first correspondence at the time of discharging, and a second correspondence between an internal pressure and the state of charge at the time of charging is partially different from the second correspondence at the time of discharging, and the electronic control unit is configured to estimate the SOC of the secondary battery. The control method includes: obtaining the open circuit voltage and the internal pressure; obtaining a first estimated value of the SOC corresponding to the time of charging and a second estimated value of the SOC corresponding to the time of discharging using the obtained open circuit voltage and the first correspondence; obtaining a third estimated value of the SOC corresponding to the time of charging and a fourth estimated value of the SOC corresponding to the time of discharging using the obtained internal pressure and the second correspondence; estimating the SOC using at least one of the first estimated value or the third estimated value in a case where a first difference between the first estimated value and the third estimated value is less than a second difference between the second estimated value and the fourth estimated value; and estimating the SOC using at least one of the second estimated value or the fourth estimated value in a case where the second difference is less than the first difference, by the electronic control unit.

The first aspect and the second aspect of the present disclosure can provide: a battery system that accurately estimates an SOC of a secondary battery in which a correspondence between an open circuit voltage and the SOC varies between the time of charging and the time of discharging; and a control method thereof.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Hereinafter, an embodiment of the present disclosure will be described in detail with reference to the drawings. In the drawings, identical or equivalent components will be represented by the same reference numerals, and the description thereof will not be repeated.

Hereinafter, a configuration in which a battery system according to an embodiment of the present disclosure is mounted on an electric vehicle will be described as an example. However, any vehicle on which a secondary battery is mounted may be used, and the present disclosure is not limited to the configuration in which the battery system is mounted on an electric vehicle. For example, the vehicle may be a hybrid vehicle (including a plug-in hybrid vehicle) on which a driving motor and an engine are mounted, or may be a hybrid vehicle on which a fuel cell is mounted. The battery system may be used not only for a vehicle but also for a stationary device.

Configuration of Battery System

Figure 1:
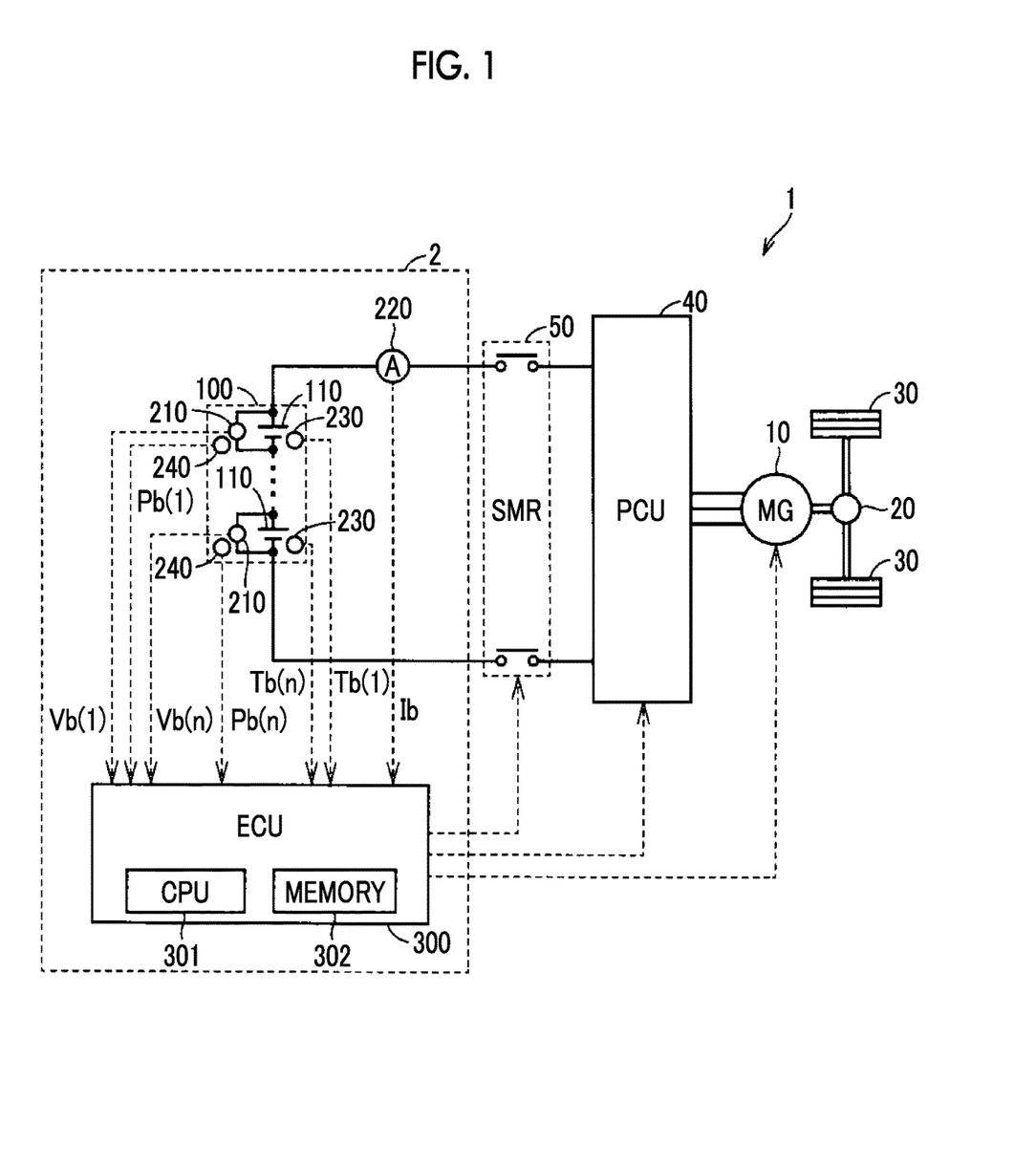
FIG. 1 is a block diagram schematically showing an overall configuration of an electric vehicle on which a battery system according to an embodiment is mounted.

FIG. 1 is a block diagram schematically showing an overall configuration of an electric vehicle 1 (hereinafter, simply referred to as "the vehicle 1") on which a battery system 2 according to the embodiment is mounted. The vehicle 1 includes a motor generator (MG) 10, a power transmission gear 20, driving wheels 30, a power control unit (PCU) 40, a system main relay (SMR) 50, and the battery system 2. The battery system 2 includes a battery pack 100, a voltage sensor 210, a current sensor 220, a temperature sensor 230, a pressure sensor 240, and an electronic control unit (ECU) 300.

The MG 10 is, for example, a three-phase alternating current rotary motor. An output torque of the MG 10 is transmitted to the driving wheels 30 through the power transmission gear 20 configured to include a reducer and a power split device. During a regenerative braking operation of the vehicle 1, the MG 10 can generate electric power using a torque of the driving wheels 30. In a configuration of the vehicle 1 shown in FIG. 1, one motor generator is provided. The number of motor generators is not limited to one, and a plurality of motor generators (for example two) may be provided.

For example, the PCU 40 includes an inverter and a converter that operate based on a control signal output from the ECU 300. At the time of discharging the battery pack 100, the converter boosts a voltage supplied from the battery pack 100 and supplies the boosted voltage to the inverter. The inverter converts a direct current power supplied from the converter into an alternating current power and drives the motor generator 10. On the other hand, at the time of charging the battery pack 100, the inverter converts an alternating current power generated by the motor generator 10 into a direct current power and supplies the converted direct current power to the converter. The converter drops a voltage supplied from the inverter to a voltage suitable for charging the battery pack 100 and supplies the dropped voltage to the battery pack 100. The PCU 40 stops charging and discharging by stopping the operations of the inverter and the converter based on a control signal output from the ECU 300. The PCU 40 may have a configuration in which the converter is not provided.

The SMR 50 is electrically connected to an electric power line through which the battery pack 100 and the PCU 40 are connected. In a case where the SMR 50 is closed according to a control signal output from the ECU 300, electric power can be exchanged between the battery pack 100 and the PCU 40.

The battery pack 100 is a rechargeable direct current power supply and is configured to include lithium ion batteries. The battery pack 100 is configured of a plural number (n number) of lithium ion batteries (single cells) 110 (hereinafter, referred to as "cells 110") being connected in series.

The voltage sensor 210 detects voltages Vb(1) to Vb(n) between respective terminals of the cells 110. The current sensor 220 detects a current Ib that is input to and output from the battery pack 100. The temperature sensor 230 detects respective temperatures Tb(1) to Tb(n) of the cells 110. For example, the pressure sensor 240 is provided between the cell 110 and a restraining member of the cell 110. The pressure sensor 240 detects pressures applied to the respective cells 110 as internal pressures Pb(1) to Pb(n). For example, the pressure sensor 240 is provided between two cells adjacent to each other.

In the following description, the voltages Vb(1) to Vb(n) of the respective cells 110 will also be referred to as "voltage Vb", the temperatures Tb(1) to Tb(n) will also be referred to as "temperature Tb", and the internal pressures Pb(1) to Pb(n) will also be referred to as "internal pressure Pb". The respective sensors output the detection results to the ECU 300.

The ECU 300 is an electronic control unit including a central processing unit (CPU) 301, a memory (read only memory (ROM) and random access memory (RAM)) 302, and an input-output buffer (not shown). The ECU 300 controls the respective devices such that the vehicle 1 and the battery system 2 are in a desired state based on the signals output from the respective sensors and information stored in the memory 302 such as a map and a program.

In the vehicle 1 having the configuration, for example, the ECU 300 can estimate an SOC of the cell 110 using a relationship (hereinafter, referred to as "first correspondence") between the SOC and an open circuit voltage (hereinafter, referred to as "OCV").

For example, the ECU 300 can estimate the OCV of the cell 110 using a method described below. Specifically, for example, the ECU 300 causes the SMR 50 to be interrupted such that the cell 110 enters a no-load condition. After a predetermined period of time elapses from the no-load condition, the voltage Vb is obtained, and the obtained voltage Vb can be estimated as the OCV.

Alternatively, for example, the ECU 300 calculates a slope of a change (change ratio) of the current Ib with respect to a change of the voltage Vb of the cell 110 per unit time, and calculates the calculated slope as an internal resistance of the cell 110. The ECU 300 can estimate the OCV by subtracting a voltage (internal resistance×current Ib) relating to the calculated internal resistance from the voltage Vb.

Alternatively, the ECU 300 can estimate the OCV by creating a numeral model using an internal reaction of the cell 110 and inputting parameters such as the current, the voltage, and the temperature. Since the method of estimating the OCV is a well-known technique, detailed description thereof will not be made.

Figure 2:
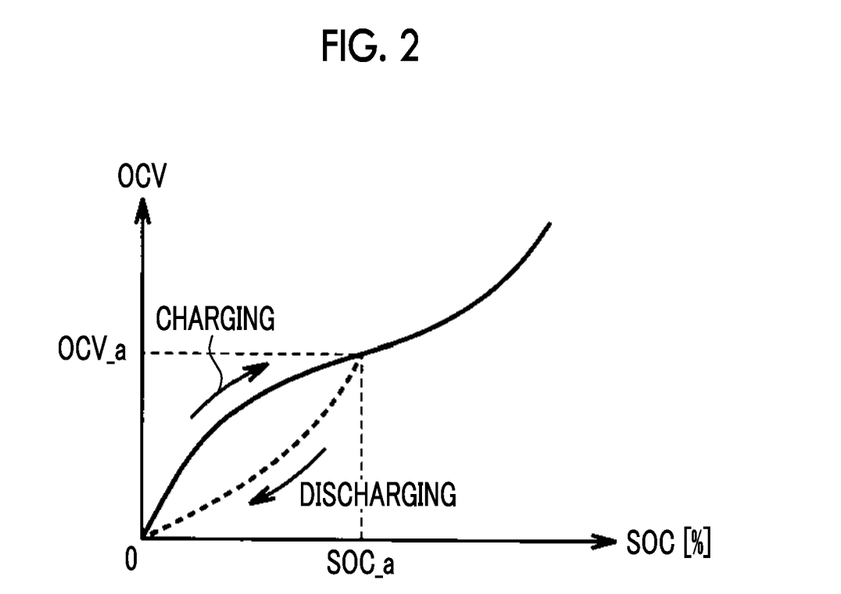
FIG. 2 is a graph showing a first correspondence between an OCV and an SOC.

The first correspondence is represented by, for example, a relationship shown in FIG. 2. FIG. 2 is a graph showing an example of the first correspondence between the OCV and the SOC. In FIG. 2, the vertical axis represents the OCV. In FIG. 2, the horizontal axis represents the SOC.

As indicated by a solid line in FIG. 2, in a region where the SOC is SOC_a or higher (that is, a region where the OCV is OCV_a or higher), the SOC is uniquely determined using the OCV at the time of charging and discharging. Therefore, the SOC of the cell 110 can be specified using the OCV estimated as described above.

However, depending on the material of a member constituting the cell 110, the first correspondence at the time of charging the cell 110 may be partially different from the first correspondence at the time of discharging the cell 110.

For example, in a case where a negative electrode that is formed of a mixture of an alloy-based active material for alloying lithium and a carbon active material is used in a lithium ion battery, the first correspondence at the time of charging the cell 110 is partially different from the first correspondence at the time of discharging the cell 110.

For example, the alloy-based active material includes any one of silicon (Si), tin (Sn), and silicon oxide (SiO). For example, the carbon active material includes any one of graphite, hard carbon, and soft carbon.

In the lithium ion battery, as shown in FIG. 2, in a region where the SOC is lower than the SOC_a (that is, a region where the OCV is lower than the OCV_a), the relationship between the OCV and the SOC changes along the solid line in FIG. 2 at the time of charging. On the other hand, the relationship between the OCV and the SOC changes along a broken line below the solid line in FIG. 2 at the time of discharging. Therefore, in the region of SOC, the SOC is not uniquely determined using the OCV at the time of charging and discharging. As a result, in the region where the SOC is lower than the SOC_a, the estimation accuracy of the SOC may deteriorate.

For example, the ECU 300 can estimate the SOC of the cell 110 using a relationship (hereinafter, referred to as "second correspondence") between the SOC and the internal pressure Pb.

Figure 3:
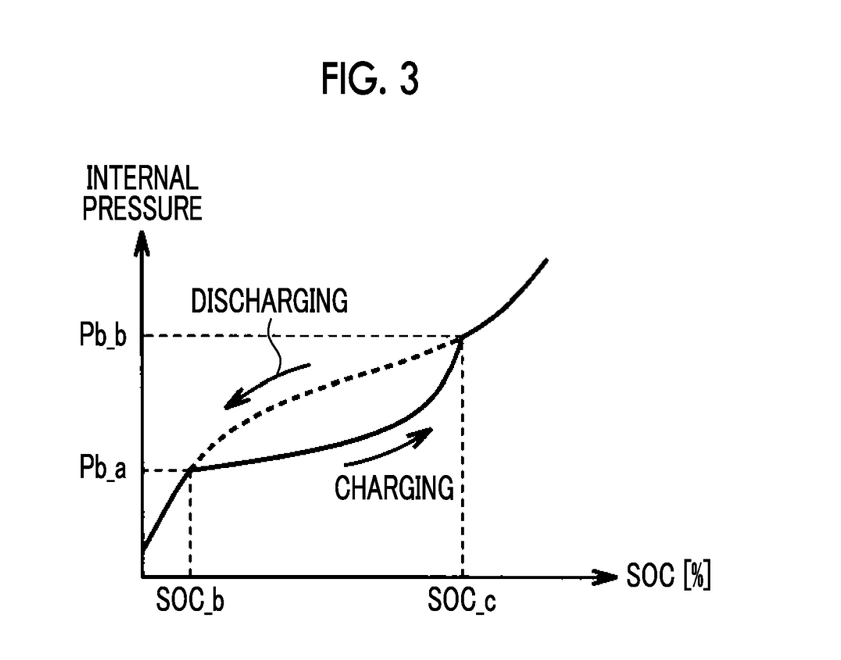
FIG. 3 is a graph showing a second correspondence between an internal pressure and the SOC.

The second correspondence is represented by, for example, a relationship shown in FIG. 3. FIG. 3 is a graph showing an example of the second correspondence between the internal pressure Pb and the SOC. In FIG. 3, the vertical axis represents the internal pressure Pb. In FIG. 3, the horizontal axis represents the SOC.

As indicated by a solid line in FIG. 3, in a region where the SOC is SOC_b or lower (that is, a region where the internal pressure Pb is Pb_a or lower) and in a region where the SOC is SOC_c or higher (that is, a region where the internal pressure Pb is Pb_b or higher), the SOC is uniquely determined using the internal pressure Pb at the time of charging and discharging. Therefore, the SOC of the cell 110 can be specified using the internal pressure Pb detected by the pressure sensor 240.

However, as in the case of the first correspondence, depending on the material of a member constituting the cell 110, the second correspondence at the time of charging the cell 110 may be partially different from the second correspondence at the time of discharging the cell 110.

For example, in a case where a negative electrode that is formed of a mixture of the alloy-based active material and the carbon active material is used in a lithium ion battery, as shown in FIG. 3, in a region where the SOC is higher than the SOC_b and lower than the SOC_c (that is, a region where the internal pressure Pb is higher than the Pb_a and lower than the Pb_b), the relationship between the internal pressure Pb and the SOC changes along the solid line in FIG. 3 at the time of charging. On the other hand, the relationship between the internal pressure Pb and the SOC changes along a broken line above the solid line in FIG. 3 at the time of discharging. Therefore, in the region of SOC, the SOC is not uniquely determined using the internal pressure Pb at the time of charging and discharging. As a result, in the region where the SOC is higher than the SOC_b and is lower than the SOC_c, the estimation accuracy of the SOC may deteriorate.

The battery system 2 according to the embodiment is characterized in that the ECU 300 operates as described below. Specifically, the ECU 300 obtains the OCV and the internal pressure Pb. The ECU 300 obtains a first estimated value of the SOC corresponding to the time of charging and a second estimated value of the SOC corresponding to the time of discharging using the obtained OCV and the first correspondence (refer to FIG. 2) between the OCV and the SOC. The ECU 300 obtains a third estimated value of the SOC corresponding to the time of charging and a fourth estimated value of the SOC corresponding to the time of discharging using the obtained internal pressure Pb and the second correspondence (refer to FIG. 3) between the internal pressure Pb and the SOC. The ECU 300 estimates the SOC using at least one of the first estimated value or the third estimated value in a case where a first difference between the first estimated value and the third estimated value is less than a second difference between the second estimated value and the fourth estimated value. The ECU 300 estimates the SOC using at least one of the second estimated value or the fourth estimated value in a case where the second difference is less than the first difference.

With the configuration described above, the SOC of the secondary battery can be accurately estimated using the appropriate estimated value.

Figure 4:
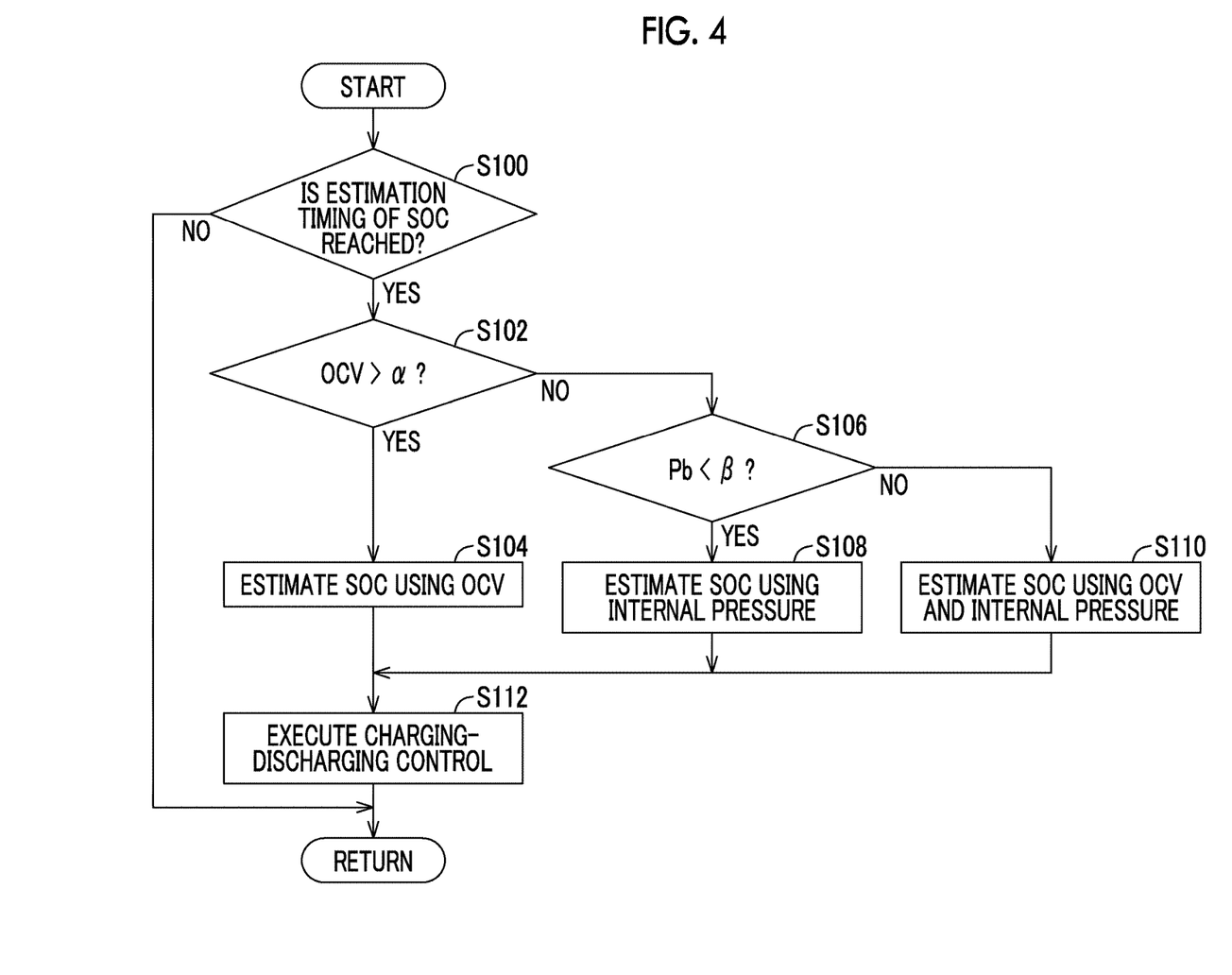
FIG. 4 is a flowchart showing a control process of selecting a method of estimating the SOC using the OCV and the internal pressure.

Hereinafter, a control process that is executed by the ECU 300 will be described using FIG. 4. FIG. 4 is a flowchart showing a control process of selecting a method of estimating the SOC using the OCV and the internal pressure Pb. The process shown in the flowchart of FIG. 4 is read from a main routine (not shown) per predetermined control period and executed. Basically, respective steps included in the flowchart of FIG. 4 are implemented by software using the ECU 300. However, some or all of the steps may be implemented by hardware (electric circuit) built into the ECU 300.

In Step (hereinafter, Step will be referred to as "S") 100, the ECU 300 determines whether or not an estimation timing of the SOC of the cell 110 is reached. For example, in a case where a predetermined period of time elapses from the time when the vehicle 1 is previously stopped (IG-OFF), immediately after the vehicle 1 starts and before the SMR 50 enters an ON state, the ECU 300 may determine that the estimation timing at which the SOC of the cell 110 is estimated is reached. Since the SMR 50 is in an OFF state, the cell 110 is under the no-load condition, and a sufficient period of time elapses from the time when the vehicle 1 is previously stopped. Therefore, the OCV and the internal pressure Pb can be obtained in a state where the cell 110 is stable.

Alternatively, in a case where a state where the load of the cell 110 is a threshold or lower (that is, the absolute value of the current Ib is a threshold or lower) is continued for a predetermined period of time or longer, the ECU 300 may determine that the estimation timing at which the SOC of the cell 110 is estimated is reached. The load of the cell 110 is low, and the state where the load is low is continued for a predetermined period of time or longer. Therefore, the OCV and the internal pressure Pb can be obtained in a state where the cell 110 is stable.

Alternatively, in a case where the temperature Tb is a threshold or higher, the ECU 300 may determine that the estimation timing at which the SOC of the cell 110 is estimated is reached. As the battery temperature increases, the internal resistance decreases. Therefore, the estimation accuracy of the OCV is improved.

In a case where the ECU 300 determines that the estimation timing of the SOC of the cell 110 is reached (YES in S100), the process proceeds to S102.

In S102, the ECU 300 determines whether or not the OCV is higher than a threshold α. As the threshold α, for example, the OCV_a in FIG. 2 described above is set. The ECU 300 estimates the OCV and determines whether or not the estimated OCV is higher than the threshold α. Since the method of estimating the OCV is as described above, detailed description thereof will not be repeated. In a case where the ECU 300 determines that the OCV is higher than the threshold α (YES in S102), the process proceeds to S104.

In S104, the ECU 300 estimates the SOC using the OCV. Specifically, the ECU 300 specifies the SOC corresponding to the estimated OCV using the estimated OCV and the first correspondence indicated by the solid line in FIG. 2.

In a case where the ECU 300 determines that the estimated OCV is the threshold α or lower (NO in S102), the process proceeds to S106. In S106, the ECU 300 determines whether or not the internal pressure Pb is lower than a threshold β. As the threshold β, for example, the Pb_a in FIG. 3 described above is set. In a case where the ECU 300 determines that the internal pressure Pb is lower than the threshold β (YES in S106), the process proceeds to S108.

In S108, the ECU 300 estimates the SOC using the internal pressure Pb. Specifically, the ECU 300 specifies the SOC corresponding to the obtained internal pressure Pb using the internal pressure Pb obtained by the pressure sensor 240 and the second correspondence indicated by the solid line in FIG. 3.

In a case where the ECU 300 determines that the internal pressure Pb is the threshold β or higher (NO in S106), the process proceeds to S110. In S110, the ECU 300 estimates the SOC using the OCV and the internal pressure Pb. In S112, the ECU 300 executes charging-discharging control of the cell 110 using the estimated SOC. For example, the charging-discharging control of the cell 110 includes at least one of a control of increasing the SOC of the cell 110 to a target value, a control of eliminating a difference in SOC between the cells 110, or a control of changing the SOC of the cell 110 in a target range. The controls are merely exemplary, and the charging-discharging control of the cell 110 is not limited to the controls. In a case where the ECU 300 determines that the estimation timing of the SOC of the cell 110 is not reached (NO in S100), the control process shown in FIG. 4 ends.

Figure 5:
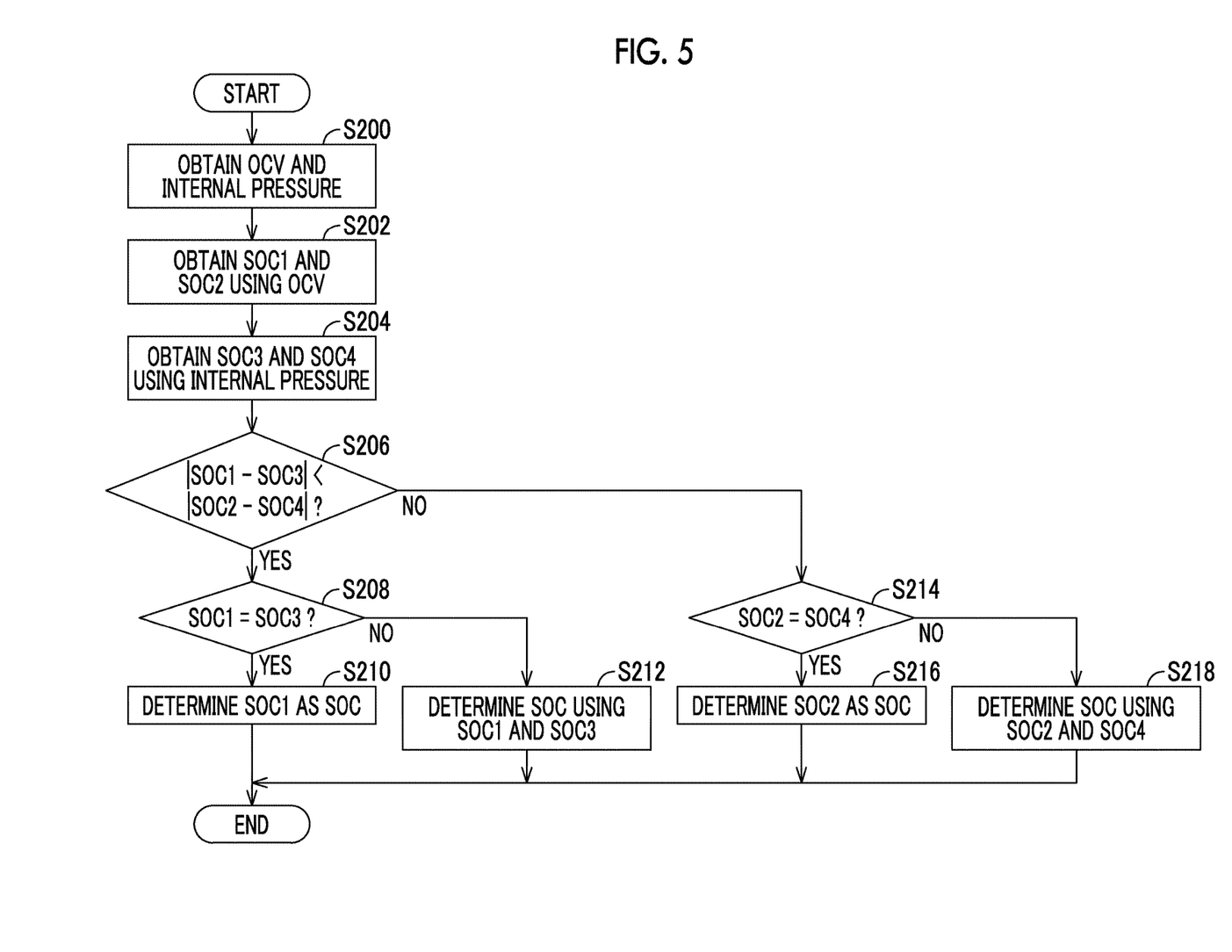
FIG. 5 is a flowchart showing a control process of estimating the SOC using the OCV and the internal pressure.

The control process that is executed by the ECU 300 will be further described using FIG. 5. FIG. 5 is a flowchart showing a control process of estimating the SOC using the OCV and the internal pressure.

In S200, the ECU 300 obtains the OCV and the internal pressure. In S202, the ECU 300 obtains a first estimated value (hereinafter, referred to as "SOC1") corresponding to the time of charging and a second estimated value (hereinafter, referred to as "SOC2") corresponding to the time of discharging using the obtained OCV and the first correspondence shown in FIG. 2.

In S204, the ECU 300 obtains a third estimated value (hereinafter, referred to as "SOC3") corresponding to the time of charging and a fourth estimated value (hereinafter, referred to as "SOC4") corresponding to the time of discharging using the obtained internal pressure and the second correspondence shown in FIG. 3.

In S206, the ECU 300 determines whether or not a first difference between the SOC1 and the SOC3 is less than a second difference between the SOC2 and the SOC4. The first difference is obtained, for example, by calculating the absolute value of SOC1-SOC3. The second difference is obtained, by calculating the absolute value of SOC2-SOC4. In a case where the ECU 300 determines that the first difference is less than the second difference (YES in S206), the process proceeds to S208.

In S208, the ECU 300 determines whether or not the SOC1 and the SOC3 match each other. For example, in a case where the first difference is a threshold (for example, zero) or less, the ECU 300 determines that the SOC1 and the SOC3 match each other. In a case where the first difference is more than the threshold, the ECU 300 determines that the SOC1 and the SOC3 do not match each other. In a case where the ECU 300 determines that the SOC1 and the SOC3 match each other (YES in S208), the process proceeds to S210.

In S210, the ECU 300 determines the SOC1 as the SOC of the cell 110. The ECU 300 may determine the SOC3 as the SOC of the cell 110.

On the other hand, in a case where the ECU 300 determines that the SOC1 and the SOC3 do not match each other (NO in S208), the process proceeds to S212.

In S212, the ECU 300 determines the SOC of the cell 110 using the SOC1 and the SOC3. Specifically, the ECU 300 determines a value between the SOC1 and the SOC3 as the SOC of the cell 110.

For example, the ECU 300 may calculate an average value of the SOC1 and the SOC3 and may determine the calculated average value as the SOC of the cell 110. Alternatively, the ECU 300 may determine a value as the SOC of the cell 110, the value being calculated by multiplying the SOC1 and the SOC3 by two weighting factors having a sum of 1, respectively, and adding up the multiplied values. The two weighting factors are adapted by an experiment or the like and are stored in advance in the memory 302 of the ECU 300.

In a case where the ECU 300 determines that the first difference is the second difference or more (NO in S206), the process proceeds to S214. In S214, the ECU 300 determines whether or not the SOC2 and the SOC4 match each other. For example, in a case where the second difference is a threshold (for example, zero) or less, the ECU 300 determines that the SOC2 and the SOC4 match each other. In a case where the second difference is more than the threshold, the ECU 300 determines that the SOC2 and the SOC4 do not match each other. In a case where the ECU 300 determines that the SOC2 and the SOC4 match each other (YES in S214), the process proceeds to S216.

In S216, the ECU 300 determines the SOC2 as the SOC of the cell 110. The ECU 300 may determine the SOC4 as the SOC of the cell 110.

On the other hand, in a case where the ECU 300 determines that the SOC2 and the SOC4 do not match each other (NO in S214), the process proceeds to S218.

In S218, the ECU 300 determines the SOC of the cell 110 using the SOC2 and the SOC4. Specifically, the ECU 300 determines a value between the SOC2 and the SOC4 as the SOC of the cell 110. Since the specific method of determining the SOC in S218 is the same as that in S212, detailed description thereof will not be repeated.

Figure 6:
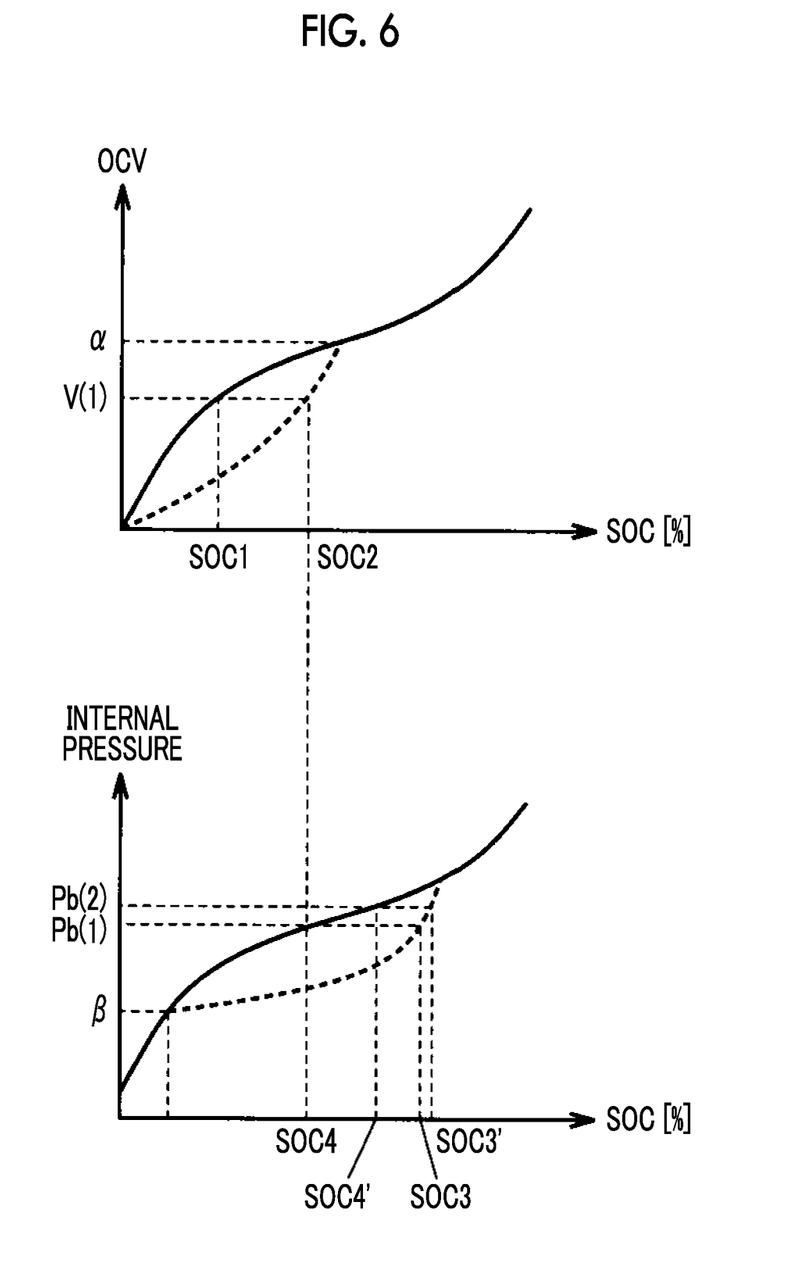
FIG. 6 is a graph showing a method of estimating the SOC using the OCV and the internal pressure.

The operations of the ECU 300 based on the structure and the flowchart will be described with reference to FIG. 6. FIG. 6 is a graph showing a method of estimating the SOC using the OCV and the internal pressure. In the upper graph in FIG. 6, the vertical axis represents the OCV, and the horizontal axis represents the first correspondence representing the SOC. The upper graph in FIG. 6 is the same as the graph representing the first correspondence in FIG. 2. In the lower graph in FIG. 6, the vertical axis represents the internal pressure Pb, and the horizontal axis represents the second correspondence representing the SOC. The lower graph in FIG. 6 is the same as the graph representing the second correspondence in FIG. 3.

Case Where OCV is V(1) and Internal Pressure Pb is Pb(1)

For example, it is assumed that the OCV is a value V(1) lower than the threshold α and that the internal pressure Pb is a value Pb(1) higher than the threshold β.

In a case where the timing at which the SOC is estimated is reached (YES in S100), the OCV V(1) is the threshold α or lower (NO in S102), and the internal pressure Pb(1) is the threshold β or higher (NO in S106). Therefore, the SOC is estimated using the V(1) and the Pb(1) (S110).

During the estimation of the SOC, the V(1) and the Pb(1) are obtained as the OCV and the internal pressure (S200), and the SOC1 and the SOC2 are obtained using the obtained V(1) (S202).

Specifically, in a case where the OCV is the V(1), the SOC is obtained as the SOC1 from a curve (solid line) that represents the first correspondence corresponding to the time of charging in the upper graph of FIG. 6. Likewise, in a case where the OCV is the V(1), the SOC is obtained as the SOC2 from a curve (broken line) that represents the first correspondence corresponding to the time of discharging.

Further, the SOC3 and the SOC4 are obtained using the obtained internal pressure Pb(1) (S204). Specifically, in a case where the internal pressure is the Pb(1), the SOC is obtained as the SOC3 from a curve (broken line) that represents the second correspondence corresponding to the time of charging in the lower graph of FIG. 6. Likewise, in a case where the internal pressure is the Pb(1), the SOC is obtained as the SOC4 from a curve (solid line) that represents the second correspondence corresponding to the time of discharging.

The second difference (SOC2−SOC4) is less than the first difference (SOC1−SOC3) (NO in S206). Therefore, the ECU 300 determines whether or not the SOC2 and the SOC4 match each other (S214). In a case where the second difference is the threshold or less, the ECU 300 determines that the SOC2 and the SOC4 match each other (YES in S214). Therefore, the ECU 300 determines the SOC2 as the SOC of the cell 110 (S216). The estimation of the SOC is performed on each of the cells 110. The ECU 300 executes the charging-discharging control of the cell 110 using the determined SOC (S112).

Case Where OCV is V(1) and Internal Pressure Pb is Pb(2) (>Pb(1))

For example, it is assumed that the OCV is a value V(1) lower than the threshold α and that the internal pressure Pb is a value Pb(2) higher than the threshold β and the Pb(1).

In a case where the timing at which the SOC is estimated is reached (YES in S100), the OCV V(1) is the threshold α or lower (NO in S102), and the internal pressure Pb(2) is the threshold β or higher (NO in S106). Therefore, the SOC is estimated using the V(1) and the Pb(2) (S110).

During the estimation of the SOC, the V(1) and the Pb(2) are obtained as the OCV and the internal pressure (S200), and the SOC1 and the SOC2 are obtained using the obtained V(1) (S202).

Further, SOC3' and SOC4' are obtained using the obtained internal pressure Pb(2) (S204). Specifically, in a case where the internal pressure is the Pb(2), the SOC is obtained as the SOC3' from the curve (broken line) that represents the second correspondence corresponding to the time of charging in the lower graph of FIG. 6. Likewise, in a case where the internal pressure is the Pb(2), the SOC is obtained as the SOC4' from the curve (solid line) that represents the second correspondence corresponding to the time of discharging.

The second difference (SOC2−SOC4') is less than the first difference (SOC1−SOC3') (NO in S206). Therefore, the ECU 300 determines whether or not the SOC2 and the SOC4' match each other (S214). In a case where the second difference is more than the threshold, the ECU 300 determines that the SOC2 and the SOC4' do not match each other (NO in S214). Therefore, the ECU 300 determines the SOC of the cell 110 using the SOC2 and the SOC4' (S218). Therefore, for example, the ECU 300 determines a value between the SOC2 and the SOC4' such as an average value of the SOC2 and the SOC4' as the SOC.

As described above, in the battery system 2 according to the embodiment, for example, in a case where the estimation of the SOC using the first correspondence and the second correspondence at the time of charging is appropriate, the first difference is less than the second difference. In a case where the estimation of the SOC using the first correspondence and the second correspondence at the time of discharging is appropriate, the second difference is less than the first difference. As described above, by comparing the first difference and the second difference to each other, the SOC of the cell 110 can be accurately estimated using the appropriate estimated value. Accordingly, a battery system that accurately estimates an SOC of a secondary battery in which a correspondence between an open circuit voltage and the SOC varies between the time of charging and the time of discharging can be provided.

Even in a case where the first difference (SOC1−SOC3) is less than the second difference (SOC2−SOC4), when the SOC1 and the SOC3 do not match each other due to error or the like, the SOC of the secondary battery can be accurately estimated by estimating a value between the SOC1 and the SOC3 as the SOC. Likewise, even in a case where the second difference is less than the first difference, when the SOC2 and the SOC4 do not match each other due to error or the like, the SOC of the cell 110 can be accurately estimated by estimating a value between the SOC2 and the SOC4 as the SOC.

Further, for example, in a case where the OCV is the threshold α or higher, the relationship at the time of charging and at the time of discharging match each other. Therefore, the SOC of the cell 110 can be accurately estimated by estimating the SOC of the cell 110 using the first correspondence.

Further, for example, in a case where the internal pressure Pb is the threshold β or lower, the relationship between the internal pressure Pb and the SOC at the time of charging and at the time of discharging match each other. Therefore, the SOC of the cell 110 can be accurately estimated by estimating the SOC of the cell 110 using the second correspondence.

As described above, by performing the charging-discharging control of the cell 110 using the accurately estimated SOC, the charging and discharging of the cell 110 can be accurately controlled.

As described above, the SOC of the cell 110 can be accurately estimated. Therefore, a difference between an actual travelable distance by which the vehicle 1 can travel using electric power and a travelable distance that is calculated using the estimated SOC can be reduced. Thus, for example, in a case where the travelable distance that is calculated using the estimated SOC is displayed to a user, the displayed travelable distance and an actual travelable distance can be made to match each other. As a result, the convenience of the vehicle for the user can be improved.

Further, the estimated SOC and an actual SOC can be made to match each other. Therefore, a difference between an estimated value of electric power that can be input to and output from the cell 110 (for example, a tolerance Win of an input electric power or a tolerance Wout of an output electric power) and an actual electric power that can be input to and output from the cell 110 can be reduced. Therefore, a case where the output electric power is more than expected or a case where the input electric power is more than expected can be suppressed. As a result, the progress of deterioration of the cell 110 can be suppressed.

Hereinafter, modification examples will be described. In the embodiment, a lithium ion battery has been described as an example of the secondary battery configured such that relationship between the OCV and the SOC at the time of charging is partially different from the relationship at the time of discharging. Any secondary batteries having the characteristics may be used, and the secondary battery is not limited to a lithium ion battery. For example, in a case where a nickel metal hydride battery has the characteristics, the nickel metal hydride battery may be used as the secondary battery.

In the description of the embodiment, in a case where the OCV is the threshold α or higher, the SOC is estimated based on the OCV and the first correspondence. However, in a case where the internal pressure Pb and the SOC in the second correspondence at the time of charging and at the time of discharging match each other, the SOC may be estimated based on the internal pressure Pb and the second correspondence.

Further, in the description of the embodiment, in a case where the internal pressure Pb is the threshold β or lower, the SOC is estimated based on the internal pressure Pb and the second correspondence. However, in a case where the OCV and the SOC in the first correspondence at the time of charging and at the time of discharging match each other, the SOC may be estimated based on the OCV and the first correspondence.

In the description of the embodiment, the internal pressure Pb of the cell 110 is detected using the pressure sensor 240 provided between the cell 110 and the restraining member. However, for example, a thin portion may be formed in a part of the exterior of the cell 110 and a displacement of the thin portion may be measured such that the internal pressure Pb can be estimated based on the measured displacement.

Some or all of the modification examples may be combined. The embodiment disclosed herein is merely exemplary in all respects and are not particularly limited. The scope of the present disclosure is not defined by the description of the embodiment and is defined by claims, and equivalent meanings to claims and modifications within claims are intended to be embraced therein.

What is claimed is:

1. A battery system comprising:
    a secondary battery configured such that a first correspondence between an open circuit voltage and a state of charge at a time of charging is partially different from the first correspondence at the time of discharging, and a second correspondence between an internal pressure and the state of charge at the time of charging is partially different from the second correspondence at the time of discharging; and
    an electronic control unit configured to estimate the state of charge of the secondary battery,
    wherein the electronic control unit is configured to
        obtain the open circuit voltage and the internal pressure,
        obtain a first estimated value of the state of charge corresponding to the time of charging and a second estimated value of the state of charge corresponding to the time of discharging using the obtained open circuit voltage and the first correspondence,
        obtain a third estimated value of the state of charge corresponding to the time of charging and a fourth estimated value of the state of charge corresponding to the time of discharging using the obtained internal pressure and the second correspondence,
        estimate the state of charge using at least one of the first estimated value or the third estimated value when a first difference between the first estimated value and the third estimated value is less than a second difference between the second estimated value and the fourth estimated value, and
        estimate the state of charge using at least one of the second estimated value or the fourth estimated value when the second difference is less than the first difference.

2. The battery system according to claim 1, wherein when the first difference is less than the second difference and the first estimated value and the third estimated value do not match each other, the electronic control unit configured to estimate a value between the first estimated value and the third estimated value as the state of charge.

3. The battery system according to claim 2, wherein the electronic control unit configured to estimate an average value of the first estimated value and the third estimated value as the state of charge.

4. The battery system according to claim 2, wherein the electronic control unit configured to estimate a value as the state of charge, the value being calculated by multiplying the first estimated value and the third estimated value by two weighting factors having a sum of 1, respectively, and adding up the multiplied values.

5. The battery system according to claim 1, wherein when the second difference is less than the first difference and the second estimated value and the fourth estimated value do not match each other, the electronic control unit configured to estimate a value between the second estimated value and the fourth estimated value as the state of charge.

6. The battery system according to claim 5, wherein the electronic control unit configured to estimate an average value of the second estimated value and the fourth estimated value as the state of charge.

7. The battery system according to claim 5, wherein the electronic control unit configured to estimate a value as the state of charge, the value being calculated by multiplying second estimated value and the fourth estimated value by two weighting factors having a sum of 1, respectively, and adding up the multiplied values.

8. The battery system according to claim 1, wherein when the obtained open circuit voltage is in a predetermined range, the electronic control unit configured to estimate the state of charge using the first correspondence, the predetermined range being a range where the first correspondence at the time of charging and the first correspondence at the time of discharging match each other.

9. The battery system according to claim 1, wherein when the obtained internal pressure is in a predetermined range, the electronic control unit configured to estimate the state of charge using the second correspondence, the predetermined range being a range where the second correspondence at the time of charging and the second correspondence at the time of discharging match each other.

10. The battery system according to claim 1, wherein when the obtained open circuit voltage is not in a range where the first correspondence at the time of charging and the first correspondence at the time of discharging match each other and the obtained internal pressure is not in a range where the second correspondence at the time of charging and the second correspondence at the time of discharging match each other, the electronic control unit configured to estimate the state of charge using the first correspondence and the second correspondence.

11. The battery system according to claim 1, wherein the electronic control unit configured to perform charging and discharging of the secondary battery using the obtained state of charge.

12. The battery system according to claim 1, wherein when the first difference is less than the second difference and the first estimated value and the third estimated value match each other, the electronic control unit configured to estimate the first estimated value or the third estimated value as the state of charge.

13. The battery system according to claim 1, wherein when the second difference is less than the first difference and the second estimated value and the fourth estimated value match each other, the electronic control unit configured to estimate the second estimated value or the fourth estimated value as the state of charge.

14. A control method of a battery system including a secondary battery and an electronic control unit, the secondary battery configured such that a first correspondence between an open circuit voltage and a state of charge at a time of charging is partially different from the first correspondence at the time of discharging, and a second correspondence between an internal pressure and the state of charge at the time of charging is partially different from the second correspondence at the time of discharging, the electronic control unit being configured to estimate the state of charge of the secondary battery, the control method comprising:

obtaining the open circuit voltage and the internal pressure, by the electronic control unit;

obtaining a first estimated value of the state of charge corresponding to the time of charging and a second estimated value of the state of charge corresponding to the time of discharging using the obtained open circuit voltage and the first correspondence, by the electronic control unit;

obtaining a third estimated value of the state of charge corresponding to the time of charging and a fourth estimated value of the state of charge corresponding to the time of discharging using the obtained internal pressure and the second correspondence, by the electronic control unit;

estimating the state of charge using at least one of the first estimated value or the third estimated value when a first difference between the first estimated value and the third estimated value is less than a second difference between the second estimated value and the fourth estimated value, by the electronic control unit; and     estimating the state of charge using at least one of the second estimated value or the fourth estimated value when the second difference is less than the first difference, by the electronic control unit.

\* \* \* \* \*